United States Patent
Liptak

(10) Patent No.: US 6,433,987 B1
(45) Date of Patent: Aug. 13, 2002

(54) PROTECTED AND PRINTED WIRING BOARD AND METHOD OF MAKING SAME

(75) Inventor: Julius Michael Liptak, Knightdale, NC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/458,529

(22) Filed: Dec. 22, 1999

(51) Int. Cl.⁷ .................................................. H02H 9/00
(52) U.S. Cl. ........................ 361/118; 361/56; 361/91.1; 361/127
(58) Field of Search ................................ 361/118, 115, 361/91.1, 56, 127

(56) References Cited

U.S. PATENT DOCUMENTS 5,905,622 A * 5/1999 Finlay, Sr. et al. .......... 361/118
6,184,464 B1 * 2/2001 Liptak et al. .............. 174/52.4

* cited by examiner

*Primary Examiner*—Stephen W. Jackson
(74) *Attorney, Agent, or Firm*—David R. Stacey; Larry T. Shrout; Larry I. Golden

(57) ABSTRACT

A method for protecting a printed wiring board (PWB) and the electrical components mounted on the PWB from high temperature, fire, plasma and debris resulting from a catastrophic failure of an at-risk electronic component located on the PWB or in close proximity to the PWB. This protection is provided by a layer of inorganic refractory material applied to a surface of the PWB adjacent the at-risk electrical component. The refractory material is preferably applied to the PWB surface as a pourable liquid. The refractor material must have sufficient viscosity such as to easily flow in and around electronic components located on the PWB and be self-leveling before curing, so as to produce a uniform thickness. The refractory material should also have a small shrinkage factor when cured such that no gaps are created between the PWB and the enclosure and around the electrical terminals of the at-risk components.

20 Claims, 2 Drawing Sheets

PROTECTED AND PRINTED WIRING BOARD AND METHOD OF MAKING SAME

FIELD OF THE INVENTION

The present invention relates to printed wiring boards and specifically to protection against damage of electrical components and traces on the printed wiring board due to high temperature, fire, plasma and debris.

BACKGROUND OF THE INVENTION

It is common to place the electronic components of transient surge suppression (TVSS) devices on printed wiring boards. Transient Voltage Surge Suppressors are generally constructed using voltage-clamping devices known as Metal Oxide Varistors (MOVs). The principal of operation of these devices is well documented in manufacturers' literature. Generally, these devices are used in shunt with a pair of conductors and act as voltage clamps, working against the impedance of the circuit, to limit the voltage at the point of connection.

It is well known that MOV devices can be damaged by continuous overvoltage (voltage that causes excessive power dissipation). In addition, MOV devices have a finite life expectancy when operated in an environment where surge voltages and currents are present. Both conditions display a similar failure mode in that a thermal avalanche within the MOV material occurs. For either failure mode (continuous overvoltage or end-of-service), the MOV clamping voltage decreases as the material heats, clamping voltage is lost, and the MOV becomes a low impedance path. Since the MOV is generally placed in shunt with a power source, the low impedance path causes significant current flow from the power source that can cause severe thermal overheating and possible bursting of the MOV device. Should a catastrophic failure occur, causing the MOV to burst, plasma will most likely be generated. In a confined space, this plasma can cause sustained arcing that will release tremendous amounts of thermal energy until a protective device operates to remove current from the circuit. Since the arc itself has some amount of impedance to the flow of current, the operation of the overcurrent protective devices is slowed. At the same time, the overtemperature devices must warm up to operating temperature in order to react. The release of thermal energy can vaporize organic (printed wiring boards) and metal (component leads and PWB traces) present in the vicinity of the arc. In the case of metal that is connected to the same electrical circuit as the arc, a transfer of the arc from the plasma to the energized metal can occur. Vaporization of organic materials by the arc generally liberates basic atomic constituents of the material that can recombine and liberate additional thermal energy thereby creating additional damage.

To minimize the damage to surrounding circuitry or apparatus during a MOV failure, various methods have traditionally been employed. Overtemperature devices that act to interrupt power supplied to the MOV have been used but generally have a slow response time. Overtemperature devices can only protect the MOV in situations where the fault current during failure is sufficiently low that immediate bursting of the MOV material does not occur. The use of overcurrent protection devices in series with the MOV can help prevent rupture of the MOV material during failure by limiting the overall energy flow into the MOV. However, the overcurrent protection device must not inadvertently operate during normal operation of the MOV. This usually means that the coordination of the overcurrent protection device with the bursting energy of the MOV is very difficult and for larger MOV arrays, not possible. To create coordination between the overcurrent protection device and MOV, a containment system is generally employed around the MOV. The function of the containment system is to manage the thermal and bursting effect of the MOV (emission of flame, fire, plasma, debris and products of combustion) until the overcurrent protection device can react. A containment method taught in U.S. Pat. No. 5,488,534, incorporated herein by reference as typical prior art, requires the MOV's to be placed on separate printed wiring boards which are located in compartments separated from other electronic components by barriers. The compartments containing MOV's are filled with compacted silica (sand). The compacted sand is then covered with an epoxy, which is also used to pot the electronic component compartments. Although compacted sand will absorb some of the plasma expelled from a bursting MOV it does not provide an adequate barrier to arcing at the MOV leads and vaporizing of the adjacent PWB. It would be advantageous to provide an easily installed means for protecting the MOV leads, printed wiring board and other electronic components from effects of arcing and plasma expelled by exploding MOV's. A more compact containment device is disclosed in U.S. patent application Ser. No. 09/067,118 filed on Apr. 27, 1998, and is hereby incorporated by reference. This containment device includes features other than compacted sand that surround the MOV's to prevent damaging missiles from being expelled from the TVSS device during a catastrophic failure. These features permit the MOV's and other TVSS electronic components to be placed on a common printed wiring board within a common enclosure. The enclosure is filled with potting material to further restrain the effects of a catastrophic failure and to prohibit circuit tampering. It is desirable to provide protection from catastrophic failure of a device such as a MOV without having to use potting material and possibly eliminate the need for compacted sand around the MOV. It is also desirable that the containment method be usable with relatively small enclosures and permit the use of one printed wiring board for all electronic components of the TVSS device.

SUMMARY OF THE INVENTION

The present invention provides protection to a printed wiring board (PWB) and the electrical components mounted on the PWB from high temperature, fire, plasma and debris resulting from a catastrophic failure of an at-risk electronic component, such as a MOV, also located on the PWB or in close proximity to the PWB. This protection is provided by a layer of inorganic refractory coating applied to a surface of the PWB adjacent the at-risk electrical component. The refractory material is preferably applied to the PWB surface as a pourable liquid. The refractory material must have sufficient viscosity such as to easily flow in and around electronic components located on the PWB and be self-leveling before curing, thus providing a uniform thickness. The refractory material should also have a small shrinkage factor when cured such that no gaps are created between the PWB and the enclosure and around the electrical terminals of the at-risk components. It is also desirable that the coating be capable of curing independent of the applied thickness.

Figure 1:
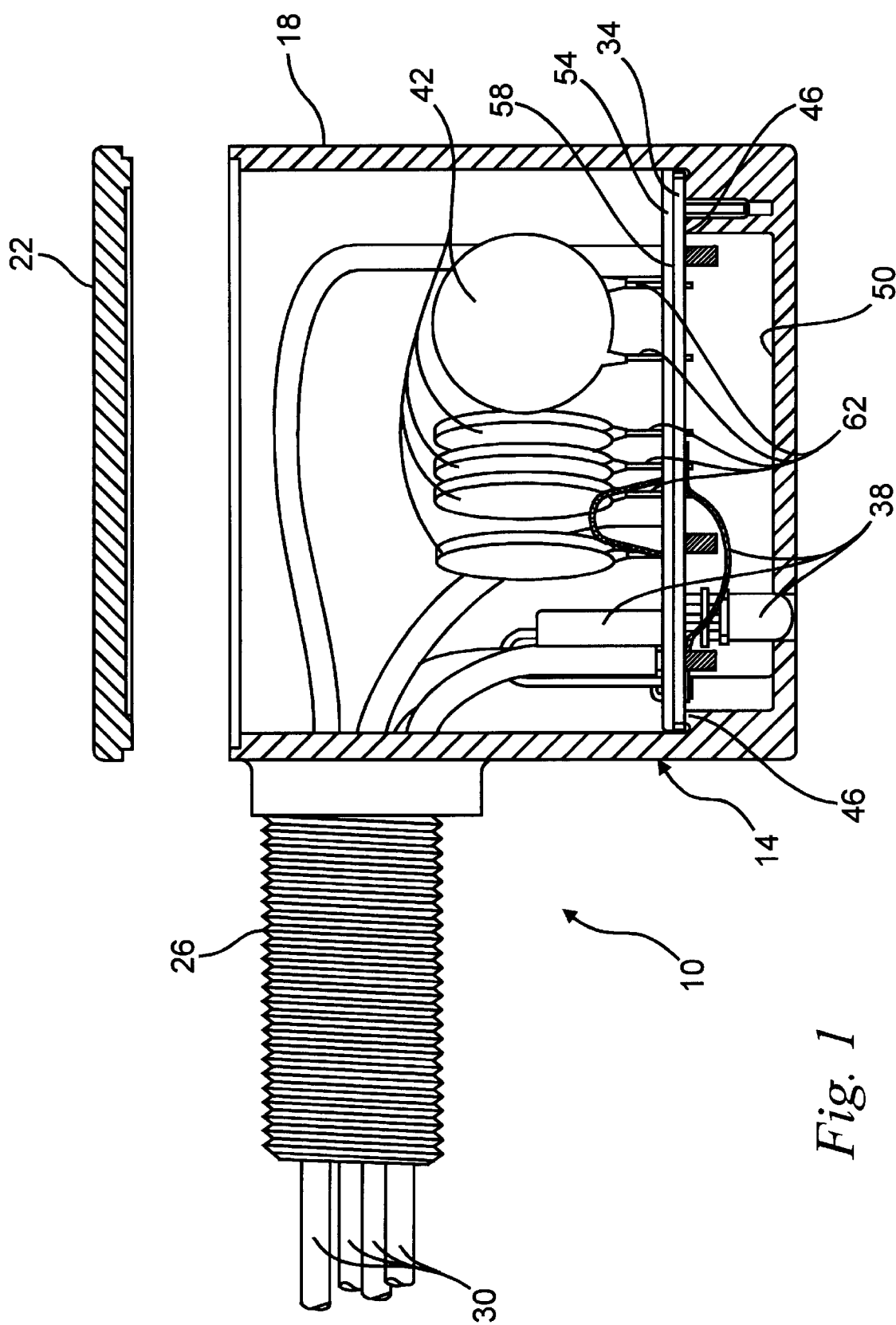
FIG. 1 is a cross-sectional view of a residential service entrance TVSS unit constructed in accordance with the present invention.

Before one embodiment of the invention is explained in detail, it is to be understood that the invention is not limited in its application to the details of construction in the description or as illustrated in the drawings. The invention is capable of other embodiments and of being practiced or being carried out in various other ways. Also, it is to be understood that the phraseology and terminology used herein is for the purpose of description and should not be regarded as limiting.

DETAILED DESCRIPTION OF THE DRAWINGS

FIG. 1 illustrates in cross-section, a residential service entrance TVSS unit constructed in accordance with the present invention and generally indicated by reference numeral 10. The TVSS unit 10 includes an enclosure 14, having a box portion 18 and a cover 22. A wiring access tube 26 is integrally formed from the box portion 18 and provides access for the connecting wires 30 of TVSS unit 10. The wiring access tube 26 can also serve as a mounting means for mounting the TVSS unit 10. Located inside the box portion 18 of the enclosure 14 is a printed wiring board (PWB) 34 on which the electronic components, generally indicated by reference numeral 38, including the at-risk components 42 such as MOVs, of the TVSS unit 10 are mounted. The PWB 34 is dimensioned to fit snugly inside the box portion 18 and is supported by a ledge 46 near a bottom surface 50 of the box portion 18. An inorganic refractory material 54, in liquid form, is poured into the box portion 18 of the enclosure 14 such that it covers a surface 58 of the PWB 34 adjacent the at-risk components 42. The viscosity of the refractory material 54 must be such that it can easily flow around all of the electrical components 38 and at-risk components 42 thus providing a uniform thickness of the refractory material 54 over the entire surface 58 of the PWB 34. The refractory material 54 must also have a small shrinkage factor when cured such that it does not pull away from the electrical components 38 or the electrical leads 62 of the at-risk components 42. Shrinkage of the refractory material 54 during curing will cause a gap or thin spot in the protective coating of refractory material 54. Duralco 215 and Rescor™ 780, both manufactured by Cotronics Corporation, 3379 Shore Parkway, Brooklyn N.Y. have been found to meet these requirements. The uniform coating thickness of the refractory material 54 should be empirically determined and is generally a function of the response of the overtemperature protective device, the fusing response of various parts of the at-risk components 42 (i.e. $I^2t$ of the leads 62, length of the leads 62 and surrounding material, etc.), the application process and other material related variables such as shrinkage of the refractory material 54. Both Duralco 215 and Rescor™ 780, applied in a uniform thickness of approximately 0.062 inch and 0.13 inch, respectively, have successfully protected the surface 58 of PWB 34 when subjected to the energy release associated with the bursting of at-risk components 42 (20 mm MOV's) protected by a 100a circuit breaker. To provide further protection, it is preferred that the at-risk components 42 have a filled-phenolic coating instead of an epoxy coating. The filledphenolic coating does not contribute significant amounts of energy to the heat reaction during breakdown and arcing of the at-risk components 42. The filled-phenolic coating does not produce large quantities of conductive combustibles during the breakdown of an at-risk component 42, which can cause conduction across insulation mediums and surfaces such as sand or the PWB 34. Filled-phenolic coated at-risk components 42 are commercially available from Maida Development Company, P.O. Box 3529, Hampton, Va. After the refractory material 54 has cured, the cover 22 is placed on the box portion 18 and sealed by a suitable process such as welding, gluing, etc. If additional protection is required, the inside of the box portion 18 can be filled with compacted sand prior to installing the cover 22.

Figure 2:
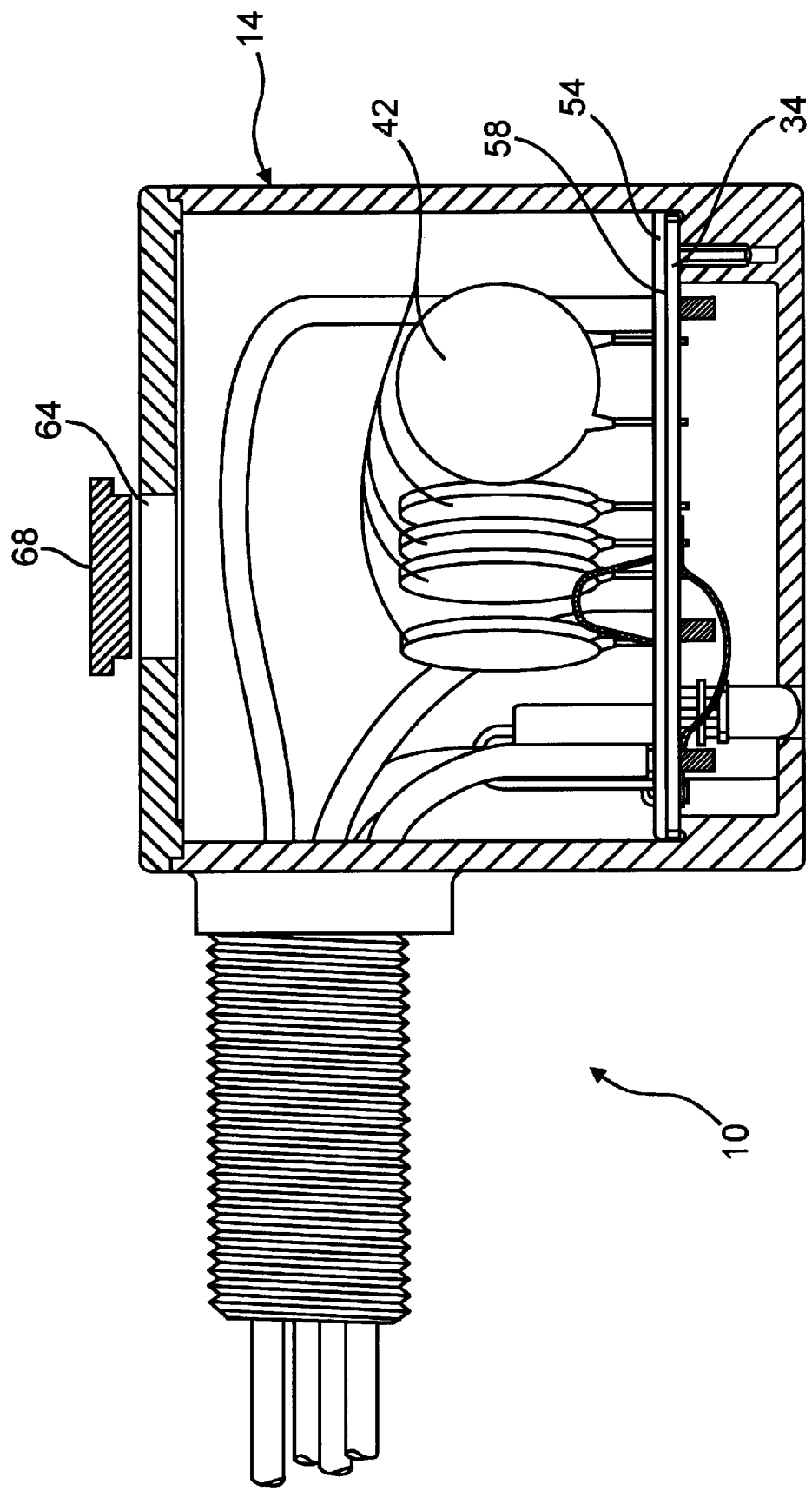
FIG. 2 is a cross-sectional view of a residential service entrance TVSS unit retrofitted in accordance with the present invention.

FIG. 2 illustrates a method of retrofitting an assembled sand filled TVSS unit 10 with refractory material 54 for additional protection of the enclosed PWB 34. The retrofit is accomplished by cutting a hole 64 in the enclosure 14 of the TVSS unit 10 through which the sand can be removed. The hole 64 should be positioned in the enclosure 14 such that a surface 58 of the PWB 34 on which the at-risk components 42 are mounted is generally perpendicular to the axis of the hole 64. The refractory material 54 can be poured through the hole 64 onto the surface 58 of the PWB 34 which is maintained in a horizontal plane during the curing process. By maintaining the surface 58 in a horizontal plane the refractory material 54 can self-level thereby curing in a uniform thickness on the surface 58 of the PWB 34. After the refractory material 54 has cured, the sand can be replaced if required, and a plug 68 is installed in the hole 64 and sealed by a suitable process such as welding, gluing, etc.

The present invention can be used in other applications requiring protection for a PWB 34 by providing a structure significantly surrounding the perimeter of the PWB 34 and of sufficient height to maintain the refractory material 54 at a uniform thickness as determined sufficient for protecting the PWB 34. The structure does not need to be permanently fixed to the PWB 34 as the cured refractory material 54 will be self-supporting. By using this means each PWB 34 of a device having multiple PWB's 34 can be protected regardless of the relative position of the PWB's 34 to one another and to the enclosure. This method of protecting PWB's 34 can also be used to protect stacked or racked PWB's 34 and pre-assembled plug-in PWB's 34.

I claim:

1. A method for protecting-a surface of a printed wiring board from damage caused by catastrophic failure of an at risk electronic component installed on or in close proximity to the surface of the printed wiring board, said method comprising the steps of:
    coating the surface of the printed wiring board adjacent the at risk electronic component with a liquid refractory material to a uniform thickness.

2. The method of claim 1 wherein said refractory material is an inorganic material.

3. The method of claim 2 wherein said refractory material has the qualities of being self-leveling.

4. The method of claim 3 wherein said refractory material has a low shrinkage factor during curing.

5. The method of claim 4 wherein said refractory material thickness is empirically determined.

6. A method of protecting a surface of a printed wiring board enclosed within a transient voltage surge suppression device from damage caused by catastrophic failure of an at risk electronic component installed on or in close proximity to the surface of the printed wiring board, said method comprising the steps of:
    installing the printed wiring board inside the transient voltage surge suppression device enclosure;
    pouring a quantity of liquid refractory material sufficient to provide a uniform coating of predetermined thickness onto the surface of the printed wiring board;

allowing the refractory material to cure; and sealing the transient voltage surge suppression device enclosure.

7. The method of claim 6 wherein said refractory material is an inorganic material.

8. The method of claim 7 wherein said refractory material has the quality of being self-leveling.

9. The method of claim 8 wherein said refractory material has a low shrinkage factor during curing.

10. The method of claim 6 wherein said predetermined thickness of said refractory material is empirically determined.

11. A method of retrofitting a device to protect a surface of a printed wiring board inside the device from damage caused by catastrophic failure of an at risk electronic component installed on or in close proximity to the surface of the printed wiring board, said method comprising the steps of:

cutting a hole in through the device enclosure adjacent the printed wiring board surface to be protected;

removing any sand that might be inside the device enclosure by pouring out through said hole;

pouring a quantity of liquid refractory material sufficient to provide a uniform coating of predetermined thickness through said hole and onto the surface of the printed wiring board;

allowing the refractory material to cure; and plugging the hole in the device enclosure.

12. The method of claim 11 wherein said refractory material is an inorganic material.

13. The method of claim 12 wherein said refractory material has the quality of being self-leveling.

14. The method of claim 13 wherein said refractory material has a low shrinkage factor during curing.

15. The method of claim 11 wherein said predetermined thickness of said refractory material is empirically determined.

16. A transient voltage surge suppression device having a protected printed wiring board, said transient voltage surge suppression device comprising:

an enclosure defining a hollow interior;

a printed wiring board mounted within said enclosure and having at least one surface requiring protection from an at-risk electronic component;

a coating of inorganic refractory material applied to said at least one surface of said printed wiring board, said coating being of a predetermined uniform thickness and completely covering said at least one surface.

17. The transient voltage surge suppression device of claim 16 wherein said at risk electronic component is a metal oxide varistor.

18. The transient voltage surge suppression device of claim 17 wherein said at risk electronic component has a nonflammable coating.

19. The transient voltage surge suppression device of claim 16 wherein said inorganic refractory material has a low shrinkage factor during curing.

20. The transient voltage surge suppression device of claim 16 wherein said predetermined uniform thickness of said inorganic refractory material is empirically determined.

* * * * *